(12) United States Patent
Kim

(10) Patent No.: US 9,793,210 B2
(45) Date of Patent: Oct. 17, 2017

(54) POWER LINE LAYOUT STRUCTURE OF SEMICONDUCTOR DEVICE AND METHOD FOR FORMING THE SAME

(71) Applicant: SK hynix Inc., Icheon-si Gyeonggi-do (KR)

(72) Inventor: Jae Hwan Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/188,052

(22) Filed: Jun. 21, 2016

(65) Prior Publication Data
US 2017/0141034 A1    May 18, 2017

(30) Foreign Application Priority Data

Nov. 13, 2015    (KR) .................. 10-2015-0159907

(51) Int. Cl.
| H01L 23/52 | (2006.01) |
| H01L 23/528 | (2006.01) |
| H01L 27/02 | (2006.01) |
| H01L 21/311 | (2006.01) |
| H01L 21/768 | (2006.01) |

(52) U.S. Cl.
CPC .... H01L 23/5286 (2013.01); H01L 21/31111 (2013.01); H01L 21/76802 (2013.01); H01L 21/76877 (2013.01); H01L 27/0207 (2013.01)

(58) Field of Classification Search
CPC ................................. H01L 23/5286
USPC .......................................... 257/773
See application file for complete search history.

(56) References Cited

U.S. PATENT DOCUMENTS

| 2010/0237508 A1* | 9/2010 | Utsumi ............. H01L 23/5286 257/774 |
| 2013/0093022 A1 | 4/2013 | Choi |
| 2014/0175662 A1* | 6/2014 | Yang .................. G06F 17/5068 257/773 |

FOREIGN PATENT DOCUMENTS

| KR | 1020120043913 A | 5/2012 |
| KR | 1020130042245 A | 4/2013 |

\* cited by examiner

*Primary Examiner* — Marc Armand
*Assistant Examiner* — Warren H Kilpatrick
(74) *Attorney, Agent, or Firm* — William Park & Associates Ltd.

(57) ABSTRACT

A power line layout structure of a semiconductor device and a method for forming the same are disclosed. The power line layout structure of the semiconductor device includes a first block region including a plurality of first and second power lines, a second block region including a plurality of first and second power lines spaced apart from the first block region by a predetermined distance. Further, a first connection pattern arranged in a boundary region between the first and second block region, and formed to interconnect the first power line of the first block region and the first power line of the second block region. Still further, a second connection pattern arranged in a boundary region between the first and second block regions, and formed to interconnect the first and second block region power lines, wherein the first and second connection patterns are formed over different layers.

13 Claims, 9 Drawing Sheets

POWER LINE LAYOUT STRUCTURE OF SEMICONDUCTOR DEVICE AND METHOD FOR FORMING THE SAME

CROSS-REFERENCE TO RELATED APPLICATION

The present application claims priority under 35 U.S.C. §119(a) to Korean patent application No. 10-2015-0159907 filed on 13 Nov. 2015 in the Korean Intellectual Property Office, the disclosure of which is hereby incorporated by reference in its entirety by reference.

BACKGROUND OF THE INVENTION

1. Technical Field

Embodiments of the present disclosure relate to a power line layout structure of a semiconductor device and a method for forming the same.

2. Related Art

With an increasing integration of semiconductor devices, demand for higher storage capacity and higher operation speed is rapidly growing, such that semiconductor devices have been developed to have higher integration and higher storage capacity at a higher speed. Various efforts for implementing high-performance semiconductor devices within a limited region have been conducted by many developers and companies.

For example, as the number of high-performance semiconductor devices has rapidly increased, the number of power lines mounted to the semiconductor devices has also rapidly increased. Since many power lines are needed for each semiconductor device, a layout structure and method for more efficiently arranging the plurality of power lines of the semiconductor device needs to be developed.

Generally, a semiconductor device includes a plurality of block regions. Each block region is a cell region including a plurality of memory cells. However, due to characteristics of the plurality of block regions, main power lines or mesh-type power lines arranged in respective block regions may sometimes be different than those of neighboring block regions thereof, resulting in an occurrence of unexpected problems.

BRIEF SUMMARY OF THE INVENTION

Various embodiments of the present disclosure are directed to providing a power line layout structure of a semiconductor device and a method for forming the same that substantially obviates one or more problems due to limitations and disadvantages of the related art.

The embodiments of the present disclosure relate to a power line layout structure of a semiconductor device in which the same power lines arranged in different block regions can be smoothly coupled to one another, and a method for forming the power line layout structure.

In accordance with an aspect of the present disclosure, a power line layout structure of a semiconductor device includes: a first block region including a plurality of first power lines and a plurality of second power lines; a second block region including a plurality of first power lines and a plurality of second power lines, and spaced apart from the first block region by a predetermined distance; a first connection pattern arranged in a boundary region between the first block region and the second block region, and formed to interconnect the first power line of the first block region and the first power line of the second block region; and a second connection pattern arranged in a boundary region between the first block region and the second block region, and formed to interconnect the second power line of the first block region and the second power line of the second block region, wherein the first connection pattern and the second connection pattern are formed over different layers.

The first power lines and the second power lines may be formed in a line shape.

Each of the first power lines and each of the second power lines may be respectively formed to receive any one selected from among a power-supply voltage and a ground voltage.

The first connection pattern may be formed over a lower layer of the second connection pattern.

The first power line and the second power line may be formed over the same layer.

The first connection pattern may be formed over a layer different from that of the first power line.

The first connection pattern may be formed in a ladder or pad shape.

The first connection pattern may include: a first bar pattern formed to extend perpendicular to the first power line; a second bar pattern spaced apart from the first bar pattern by a predetermined distance, and formed to extend parallel to the first bar pattern; and a plurality of third bar patterns perpendicular to the first bar pattern and the second bar pattern, and formed to interconnect the first bar pattern and the second bar pattern.

The first connection pattern may further include: an auxiliary pattern formed to extend to the first connection patterns facing each other in the first power lines; and a contact coupled to the auxiliary pattern.

The first power lines of the first block region may be coupled to the first bar pattern through the contact; and the first power lines of the second block region may be coupled to the second bar pattern through the contact.

The second connection pattern may be formed over the same layer as the second power lines.

The second connection pattern may be formed in a bar shape.

The second connection pattern may be formed to extend perpendicular to the first power lines and the second power lines.

The power line layout structure may further include: auxiliary patterns formed to extend to the second connection patterns and face each other in the second power lines, wherein the auxiliary pattern is coupled to the second connection pattern.

In accordance with another aspect of the present disclosure, a method for forming a power line layout structure of a semiconductor device includes: forming a first insulation film over a semiconductor substrate formed to include a plurality of block regions and a boundary region disposed between the block regions; forming a first connection pattern over the first insulation film of the boundary region; forming a second insulation film over the first connection pattern; forming at least one contact coupled to the first connection pattern by etching the second insulation film; and forming a first power line and a second power line over the second insulation film of each of the block regions, and forming a second connection pattern over the second insulation film of the boundary region, wherein the first power line is coupled to the first connection pattern through the contact, and the second power line is coupled to the second connection pattern.

The first connection pattern may be formed in a ladder or pad shape.

The second connection pattern may be formed in a bar shape.

The first power line and the second power line may be formed in a line shape.

The first connection pattern and the second connection pattern may be formed to extend perpendicular to the first power line and the second power line.

The first power line and the second power line may be formed to receive any one selected from among a power-supply voltage and a ground voltage.

It is to be understood that both the foregoing general description and the following detailed description are exemplary and explanatory and are intended to provide further explanation of the claims.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

In order to access data, a semiconductor memory device needs various operation power-supply voltages, for example, an external power-supply voltage, a ground voltage, an internal power-supply voltage, a reference voltage, a high voltage, etc.

The operation power-supply voltages may be transmitted to a cell region of the semiconductor memory device, and layout structures of power lines formed in respective block regions to transmit the operation power-supply voltages may be different in structure from one another according to an internal connection state and a layout structure of the plurality of block regions.

Various embodiments of the present disclosure provide a power line layout structure of a semiconductor device to solve the problem in which, when positions of power lines arranged in individual block regions are different from each other, the same power lines of two juxtaposed block regions are not all connected to each other, and a method for forming the power line layout structure of the semiconductor device.

Figure 1A:
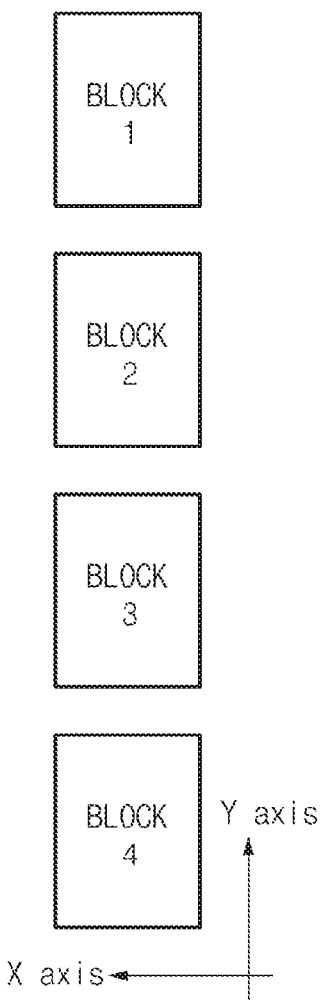
FIGS. 1A and 1B are layout diagrams illustrating a layout structure of a plurality of block regions.
Figure 1B:
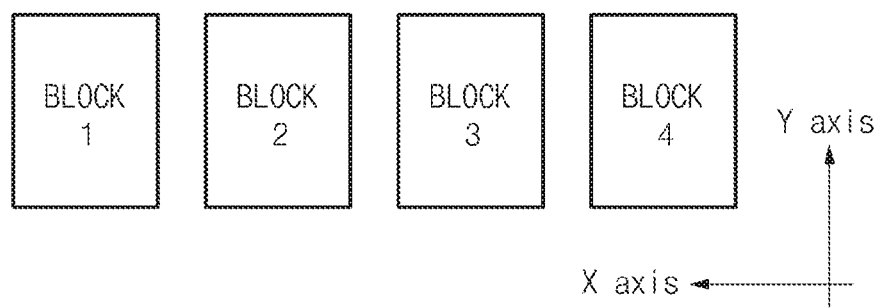

FIGS. 1A and 1B are conceptual diagrams illustrating a layout structure of a plurality of block regions.

Referring to FIGS. 1A and 1B, each block region (BLOCK1, BLOCK2, BLOCK3, BLOCK4) may include a plurality of unit memory cells, each of which includes a plurality of word lines (not shown), and a plurality of bit lines (not shown).

In addition, an external part of each block region (BLOCK1, BLOCK2, BLOCK3, BLOCK4) may further include a power-supply pad (not shown) configured to receive a power-supply voltage (VDD) and a ground pad (not shown) configured to receive a ground voltage (VSS).

According to the above-mentioned block regions (BLOCK1~BLOCK4), each of which includes the above-mentioned constituent elements, respective block regions may be spaced apart from each other by a predetermined distance in one or more directions.

Figure 2A:
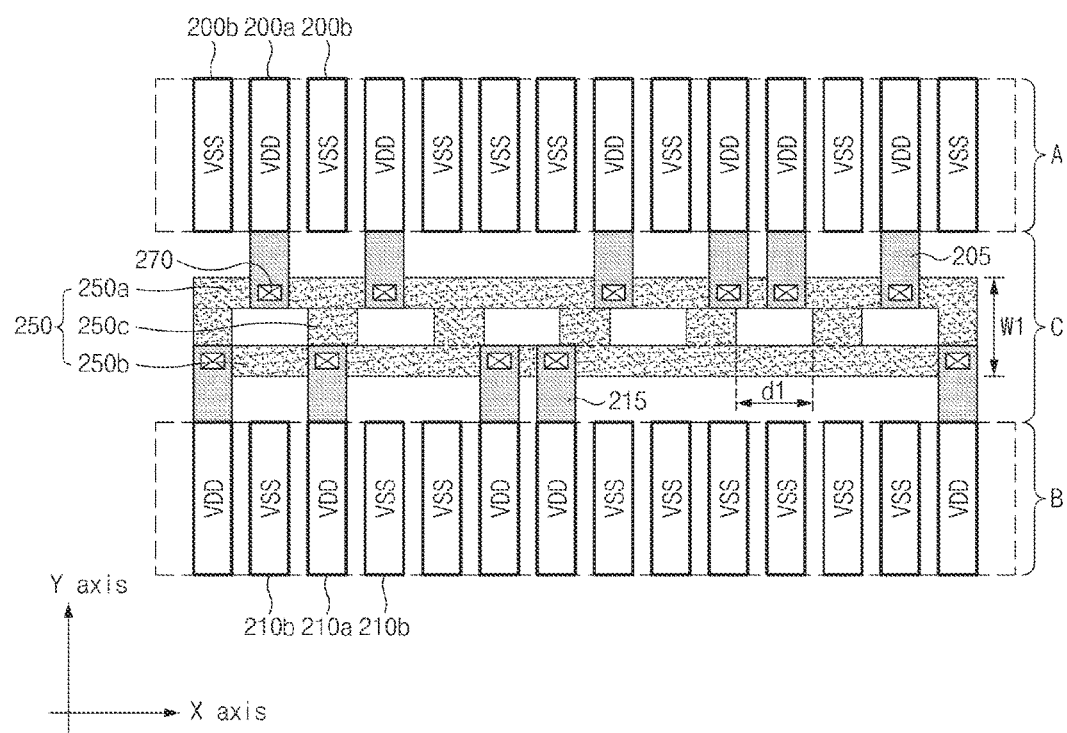
FIGS. 2A to 2C are layout diagrams illustrating a power line layout structure of a semiconductor device according to an embodiment of the present disclosure.
Figure 2B:
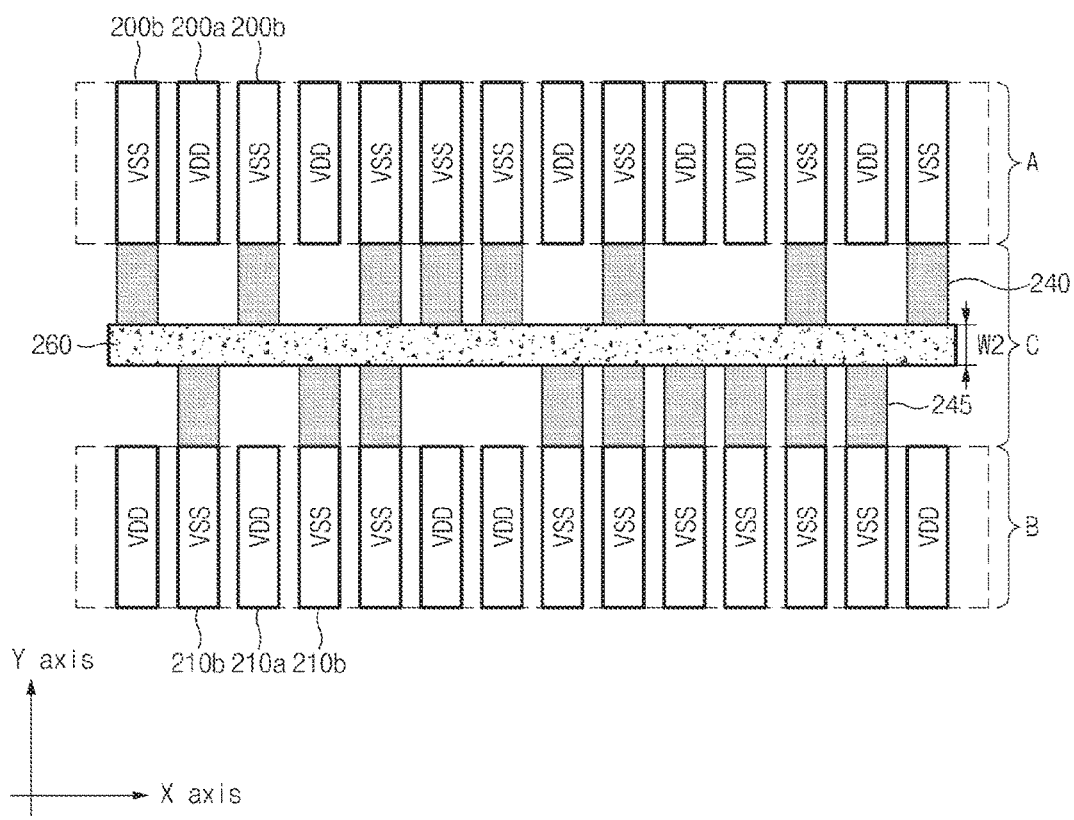

For example, the block regions (BLOCK1~BLOCK4) may be spaced apart from each other by a predetermined distance in a Y-axis direction as shown in FIG. 2A. In addition, the block regions (BLOCK1~BLOCK4) may be spaced apart from each other by a predetermined distance in an X-axis direction as shown in FIG. 2B. Although the block regions are arranged in the X-axis and Y-axis direction for convenience of description, the scope and spirit of the present disclosure is not limited thereto, and the block regions may be arranged in various shapes and various forms. For example, the block regions may be arranged in the form of a matrix.

Figure 2C:
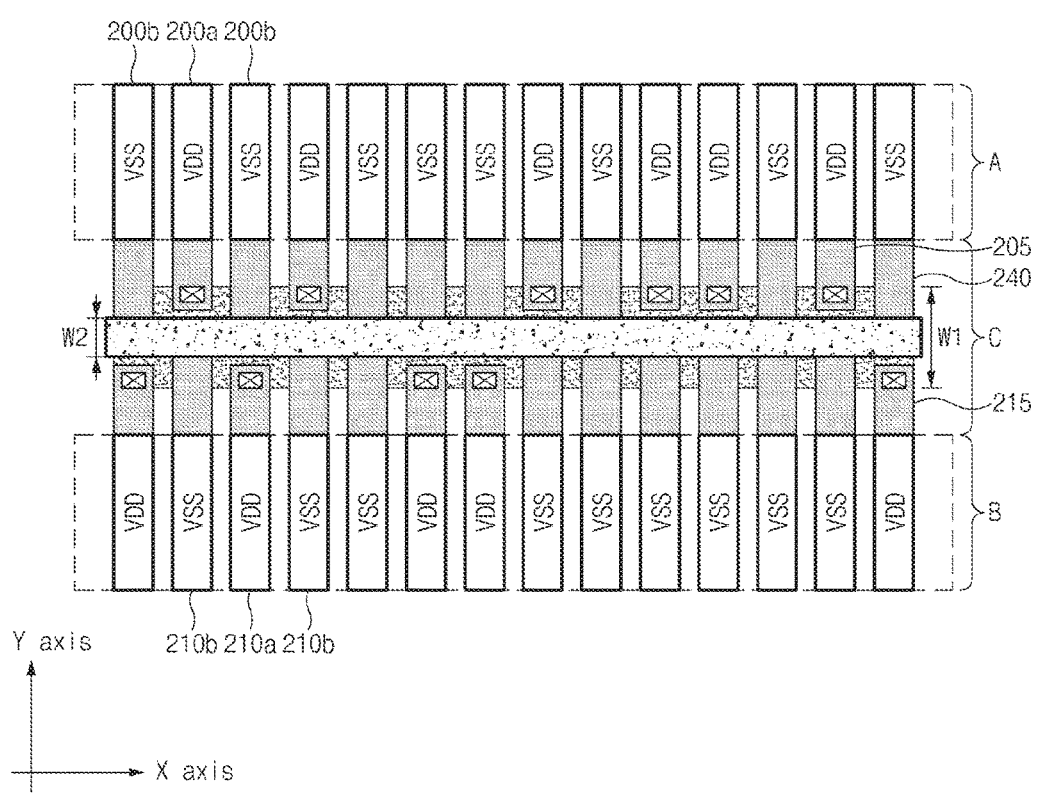

FIGS. 2A to 2C are layout diagrams illustrating a power line layout structure of a semiconductor device according to an embodiment of the present disclosure. FIGS. 2A to 2C illustrate a connection relationship between power lines arranged in the plurality of block regions, and the remaining constituent elements other than power lines will be herein omitted for convenience of description.

Although two juxtaposed block regions are disclosed for convenience of description, the power line layout structure according to various embodiments can be applied not only to two juxtaposed block regions, but to all the layout structures of semiconductor devices.

Referring to FIG. 2A, a first block region A is first arranged and a second block region B is then spaced a predetermined distance apart from the first block region. A region between the first block region A and the second block region B is defined as a boundary region C. The boundary region C may be an isolation region in which there are no additional circuits.

Although FIG. 1A illustrates the first block region A and the second block region B located adjacent to each other in the Y-axis direction, the present disclosure is not limited thereto, and the first and second block regions (A, B) may also be arranged in various shapes irrespective of the X-axis or Y-axis direction.

The first block region A may include a plurality of first power lines 200a and a plurality of second power lines 200b, and the second block region B may also include a plurality of first power lines 210a and a plurality of second power lines 210b. Although FIG. 2A illustrates that the first power line 210a is identical in size and shape to the second power line 210b, the present disclosure is not limited thereto, and the first power line 210a and the second power line 210b may have different sizes and different shapes.

The first power lines (200a, 210a) may be used to provide a first voltage, and the second power lines (200b, 210b) may be used to provide a second voltage. Here, the first voltage may be a power-supply voltage (VDD) and the second voltage may be a ground voltage (VSS). In contrast, the first voltage may be a ground voltage (VSS) and the second voltage may be a power-supply voltage (VDD) as necessary.

The first power lines (200a, 210a) and the second power lines (200b, 210b) may be formed in a line shape extending in the Y-axis direction. The first power lines (200a, 210a)

may be spaced apart from the second power lines (200b, 210b) by a predetermined distance in the X-axis direction.

The external part of the first block region A and the second block region B may further include a power pad (not shown) configured to receive a power-supply voltage (VDD) and a ground voltage (VSS) from an external power source. The first power lines (200a, 210a) and the second power lines (200b, 210b) may be coupled to the power pad (not shown).

The order of arranging the first power lines (200a, 210a) and the second power lines (200b, 210b) is not limited to the structure of FIG. 2A, and the first power lines (200a, 210a) and the second power lines (200b, 210b) may also be arranged in various ways according to the situation.

For example, the first power lines (200a, 210a) and the second power lines (200b, 210b) may be arranged in an alternating manner. The first power lines (200a, 210a) or the second power lines (200b, 210b) may be repeatedly arranged consecutively so that, for example, one or more first power lines 200a are arranged next to each other, or one or more second power lines 200b are arranged next to each other. This same arrangement may apply to other first power lines 210a and second power lines 210b. In this case, the number of power lines contained in one block region may be changed according to the memory capacity of the semiconductor device or the like.

In addition, the first and second power lines (200a, 200b) contained in the first block region A may possibly not be symmetrical to (or may possibly not be identical in structure to) the first and second power lines (210a, 210b) contained in the second block region B arranged on two sides of the boundary region C.

Assuming that power lines formed in two juxtaposed block regions (A, B) are different from each other, an embodiment of the present disclosure aims to facilitate connection of the same power lines formed in the two block regions (A, B). Therefore, an example in which layout structures of power lines formed in two block regions (A, B) are different from each other (i.e., the respective block regions are asymmetrical to each other in the boundary region C) will hereinafter be described. However, embodiments of the present disclosure may also be applied to other examples in which a layout structure of power lines formed in two block regions (A, B) are identical to each other without departing from the scope and spirit of the present disclosure.

A first connection pattern 250 for interconnecting the same power lines (e.g., the first power lines 200a and 210a) from among all power lines arranged in the first block region A and the second block region B may be arranged in the boundary region C. The first connection pattern 250 may be formed over another layer different from those of the first power lines (200a, 210a) and the second power lines (200b, 210b).

For example, the first connection pattern 250 may be formed below the first power lines (200a, 210a) and the second power lines (200b, 210b). In addition, the first power lines (200a, 210a) and the second power lines (200b, 210b) may be formed above the first connection pattern 250.

The first connection pattern 250 may be formed in a ladder shape or in a single pad shape.

The ladder-shaped first connection pattern 250 may include a first bar pattern 250a extending in the X-axis direction and perpendicular to at least one of the first power lines (200a, 210a) and second power lines (200b, 210b), and a second bar pattern 250b extending parallel to the first bar pattern 250a while being spaced apart from the first bar pattern 250a by a predetermined distance. In addition, the ladder-shaped first connection pattern 250 may further include a plurality of third bar patterns 250c formed to cross the first and second bar patterns (250a, 250b) as well as to interconnect the first bar pattern 250a and the second bar pattern 250b.

The third bar patterns 250c may be spaced apart from each other by a predetermined distance (d1). The distance (d1) between the third bar patterns 250c may be changed in consideration of power line resistance.

The first connection pattern 250 may be coupled to both the first power line 200a arranged in the first block region A and the first power line 210a arranged in the second block region B.

The first power line 200a of the first block region A may further include a first auxiliary pattern 205 extending to (or extending in the Y-axis direction) and having a part overlapping the first bar pattern 250a, and the first power line 200a may be electrically coupled to the first bar pattern 250a through a contact 270 coupled to the first auxiliary pattern 205.

In addition, the first power line 210a of the second block region B may further include a second auxiliary pattern 215 extending to (or extending in the Y-axis direction) and having a part overlapping the second bar pattern 250b, and the first power line 210a may be electrically coupled to the second bar pattern 250b through a contact 270 coupled to the second auxiliary pattern 215. In this case, the first auxiliary pattern 205 and the second auxiliary pattern 215 may be formed over the same layer as those of the first power lines (200a, 210a).

The first connection pattern 250 is formed over a layer different than those of the first power lines (200a, 210a) and the second power lines (200b, 210b), such that the first connection pattern 250 may be coupled through a separate contact 270. In other words, the first power lines (200a, 210a) respectively arranged in the first block region A and the second block region B may be coupled through the first connection pattern 250.

Referring to FIG. 2B, a second connection pattern 260 may be arranged in the boundary region C between the first block region A and the second block region B.

The second connection pattern 260 may be formed in a bar shape extending in the X-axis direction, and may be formed over the same layer as at least one of the first power lines (200a, 210a) and the second power lines (200b, 210b). In other words, the first connection pattern 250 and the second connection pattern 260 may be formed over different layers.

The second connection pattern 260 may be coupled to the second power line 200b arranged in the first block region A and the second power line 210b arranged in the second block region B. The second power line 200b of the first block region A may further include a third auxiliary pattern 240 extending to contact the second connection pattern 260. In addition, the second power line 210b of the second block region B may further include a fourth auxiliary pattern 245 extending to contact the second connection pattern 260. Each of the third auxiliary pattern 240 and the fourth auxiliary pattern 245 may be electrically coupled to the second connection pattern 260.

That is, the second power lines (200b, 210b) respectively arranged in the first block region A and the second block region B may be coupled through the second connection pattern 260.

Conventionally, assuming that layout structures of power lines formed in two juxtaposed block regions are different from each other, a plurality of power lines may be unavoidably interconnected, resulting in the occurrence of unexpected problems. In contrast, according to the embodiments of the present disclosure, additional connection patterns are arranged between two block regions as shown in FIGS. 2A and 2B, all the same power lines formed in two block regions can be coupled to each other.

FIG. 2C is a conceptual diagram illustrating a layout structure in which the first connection pattern 250 and the second connection pattern 260 are arranged. In more detail, as can be seen from FIG. 2C, the first power lines (200a, 210a) or the second power lines (200b, 210b) formed in the first block region A and the second block region B may be interconnected. That is, the same power lines formed in the first and second block regions (A, B) may be interconnected.

Referring to FIG. 2C, the first connection pattern 250 and the second connection pattern 260 may be arranged in the boundary region C between the first block region A and the second block region B, and the first connection pattern 250 and the second connection pattern 260 may be formed over different layers.

The first connection pattern 250 may interconnect all the first power lines (200a, 210a) of the first block region A and the second block region B through the contact 270. The second connection pattern 260 may interconnect all the second power lines (200b, 210b) of the first block region A and the second block region B.

In this case, the first connection pattern 250 may also be formed in shapes other than the ladder shape as needed. For example, the first connection pattern 250 may also be formed in a single pad shape. However, there is needed a difference between one critical dimension (CD) W1 of the first connection pattern 250 and another critical dimension (CD) W2 of the second connection pattern 260 formed at an upper part.

Assuming that the CD W1 of the first connection pattern 250 is identical to the other CD W2 of the second connection pattern 260, the first power lines (200a, 210a) may be coupled to the second power lines (200b, 210b), if an unexpected bridge (i.e., short-circuit between power lines) occurs, resulting in the occurrence of a failed part.

Therefore, the first connection pattern 250 and the second connection pattern 260 may be formed in various shapes within range in which the Y-axis directional critical dimensions (W1, W2) are different from each other. For convenience of description and better understanding of the present disclosure, although the first critical dimension W1 is larger than the second critical dimension W2, the scope and spirit of the present disclosure is not limited thereto.

As described above, the first connection pattern 250 may be arranged over a lower layer, and the second connection pattern 260 may be arranged over an upper layer, such that the same power lines contained in two block regions can be coupled to each other.

Although two connection patterns are disclosed, the scope and spirit of the present disclosure is not limited to the two connection patterns. If additional power lines are arranged, additional connection patterns may be added to or arranged in another layer. In addition, the second power lines (200b, 210b) may be coupled through the first connection pattern 250, and the first power lines (200a, 210a) may also be coupled through the second connection pattern 260.

As described above, all the same power lines arranged in several block regions are coupled using connection patterns formed over different layers, such that all the power lines can be easily coupled between the block regions. Since all the power lines are easily coupled, problems such as a power drop can be addressed.

Figure 3A:
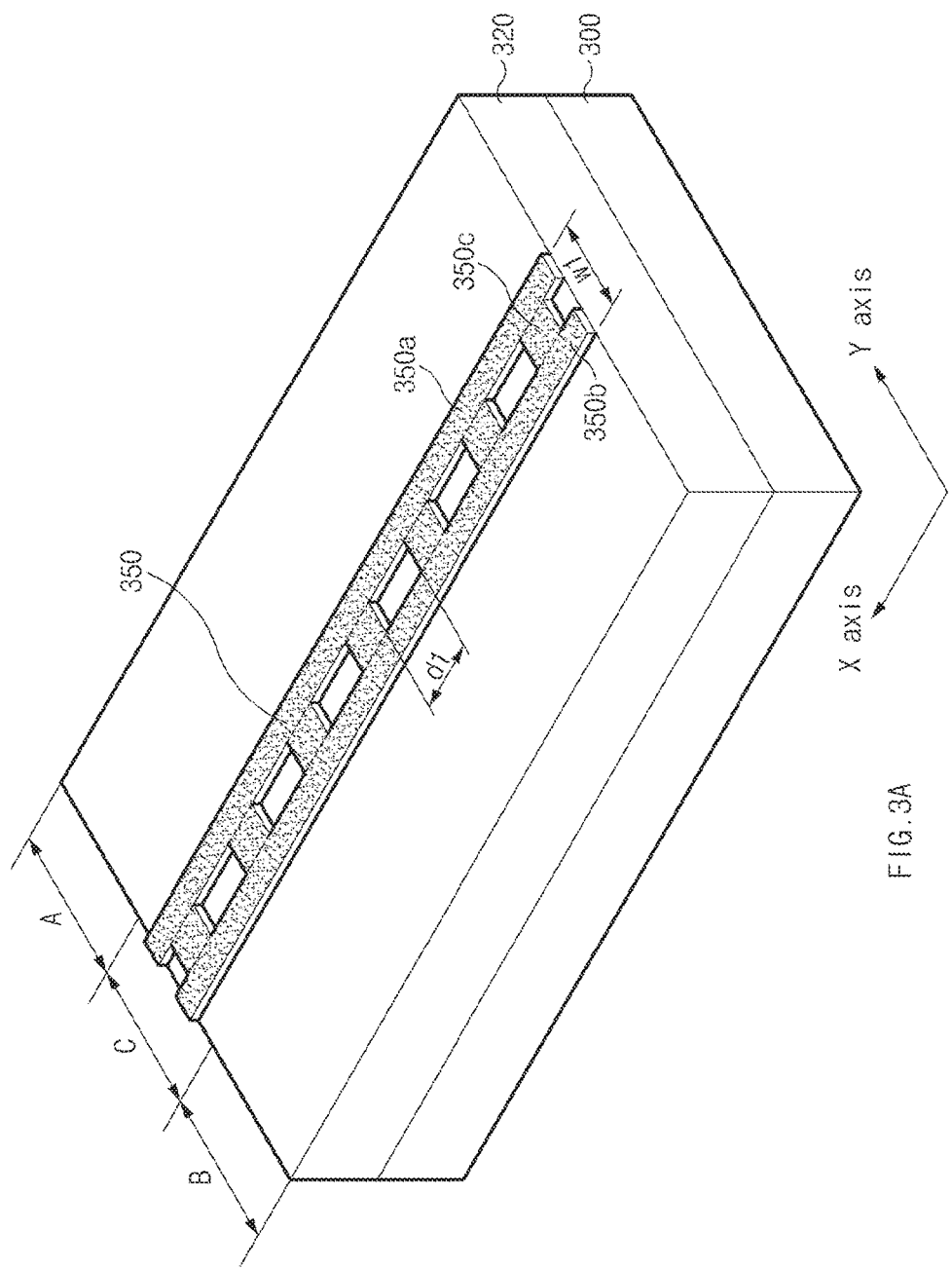
FIGS. 3A to 3C are perspective views illustrating a method for arranging power lines of a semiconductor device according to an embodiment of the present disclosure.
Figure 3B:
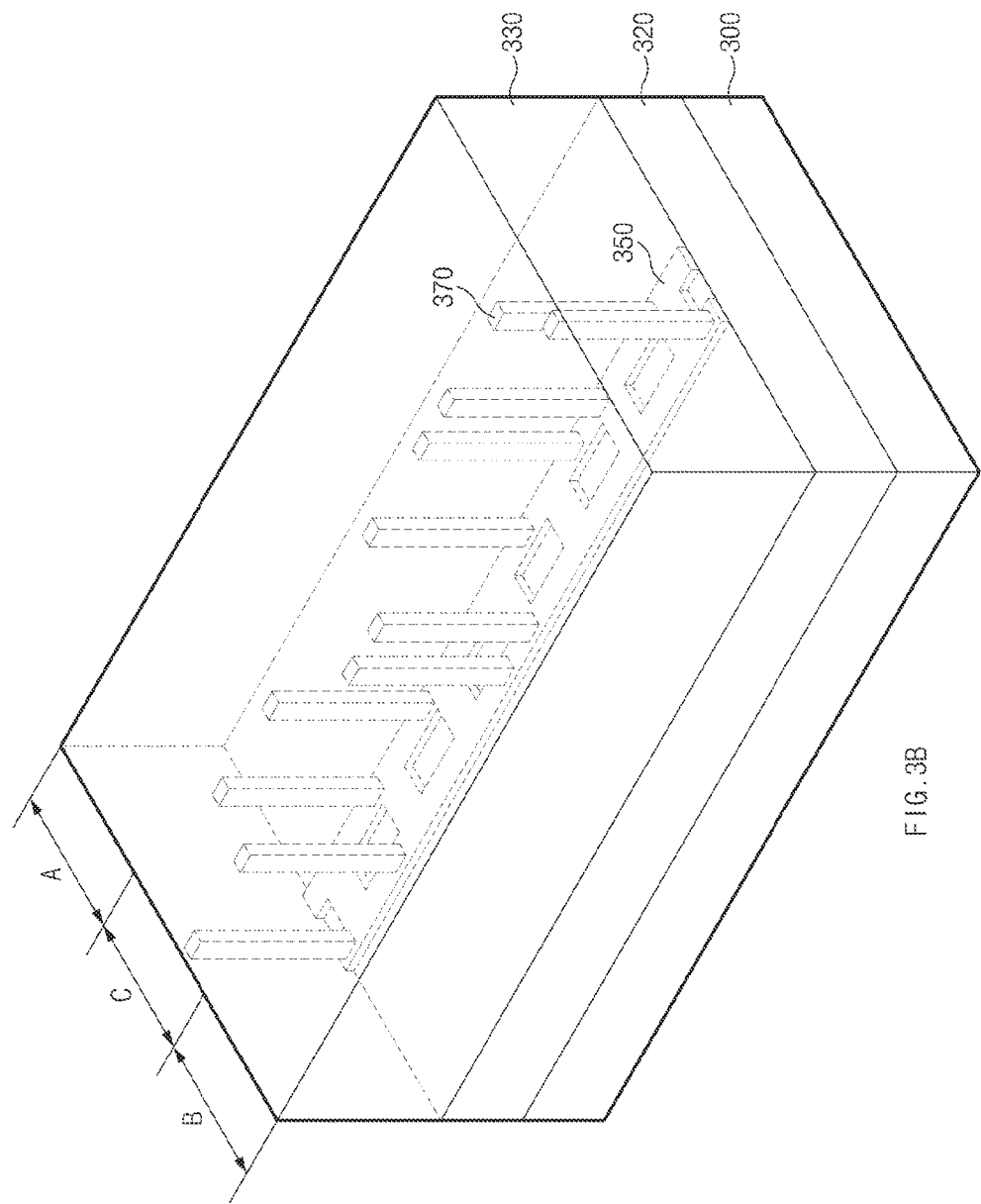
Figure 3C:
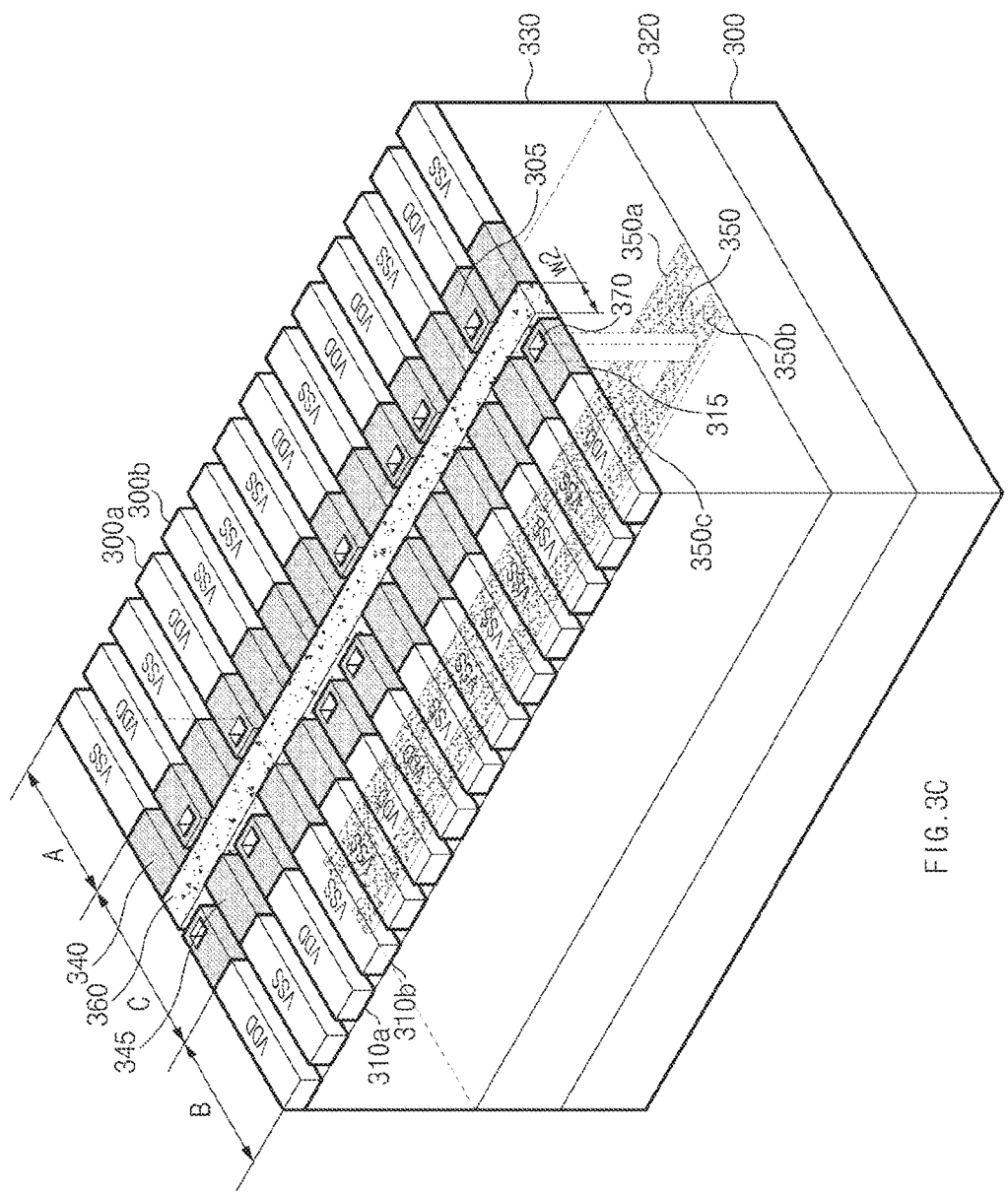

FIGS. 3A to 3C are perspective views illustrating a method of forming a semiconductor device including connection patterns formed to interconnect power lines according to an embodiment of the present disclosure.

Referring to FIG. 3A, the semiconductor device may include a first block region A and a second block region B, and may include a first insulation film 320 disposed over the entire surface of a semiconductor substrate 300 including a boundary region C disposed between two block regions. The first insulation film 320 may be formed of a Boron Phosphorus Silicate Glass (BPSG) film, a Phosphorus Silicate Glass (PSG) film, a Fluorinated Silicate Glass (FSG) film, a High-Density Plasma (HDP) film, a Tetra-Ethyl-Ortho-Silicate (TEOS) film, or a combination thereof.

The first connection pattern 350 may be formed over the first insulation film 320 of the boundary region C.

The first connection pattern 350 may be formed in a ladder shape. The first connection pattern 350 will hereinafter be described with reference to the attached drawings.

The first connection pattern 350 may include a first bar pattern 350a extending in the X-axis direction, and a second bar pattern 350b extending parallel to the first bar pattern 350a. The second bar pattern 350b may be spaced apart from the first bar pattern 350a by a predetermined distance in the Y-axis direction. In this case, the first bar pattern 350a and the second bar pattern 350b may have the same length.

In addition, the first connection pattern 350 may further include several third bar patterns 350c, which extend in the Y-axis direction perpendicular to the first bar pattern 350a and the second bar pattern 350b and interconnect the first bar pattern 350a and the second bar pattern 350b. In this case, the third bar patterns 350c may be spaced apart from each other by a predetermined distance (d1). The distance (d1) between the third bar patterns 350c may be adjusted based on resistance of the first power lines (300a, 310a) formed in a subsequent process.

The first connection pattern 350 is not limited to a ladder shape, and it should be noted that the first connection pattern 350 can also be formed in other shapes capable of interconnecting the first power lines (300a, 310a) without departing from a scope and spirit of the present disclosure. For example, the first connection pattern 350 may be formed in a pad shape, and the critical dimension W1 of the first connection pattern 350 may be larger than the other critical dimension W2 of the second connection pattern (see 360 of FIG. 3C) to be formed in a subsequent process.

Referring to FIG. 3B, a second insulation film 330 may be formed over the entire surface of the first insulation film 320 including the first connection pattern 350. The second insulation film 330 may be formed of the same material as the first insulation film 320.

The second insulation film 330 is etched such that a plurality of contact holes to expose the first bar pattern 350a and the second bar pattern 350b of the first connection pattern 350 may be formed. Subsequently, a conductive material is buried in the contact holes, resulting in formation of a plurality of contacts 370. The contacts 370 may be formed at a specific location in which the first power lines (300a, 310a) are to be formed in a subsequent process.

Referring to FIG. 3C, the first power lines (300a, 310a) and the second power lines (300b, 310b) may be formed over the second insulation film 330 of the first block region A and the second block region B. The first power lines (300a, 310a) and the second power lines (300b, 310b) may each be formed in a line shape extending in the Y-axis direction, and may be spaced apart from each other by a predetermined distance in the X-axis direction. Although the first power lines (300a, 310a) and the second power lines (300b, 310b) have the same size and shape as shown in FIG. 3C, the scope and spirit of the present disclosure is not limited thereto, and the first power lines (300a, 310a) and the second power lines (300b, 310b) may also have different sizes and shapes as needed.

The first block region A and the second block region B may include the first power lines (300a, 310a) and the second power lines (300b, 310b). The first power lines (300a, 310a) and the second power lines (300b, 310b) may be arranged in an alternating manner and it should be noted that the same power lines may also be repeatedly arranged several times.

The first power lines (300a, 310a) may be power lines to receive the power-supply voltage (VDD), and the second power lines (300b, 310b) may be power lines to receive the ground voltage (VSS). In contrast, the first power lines (300a, 310a) may be power lines to receive the ground voltage (VSS), and the second power lines (300b, 310b) may be power lines to receive the power-supply voltage (VDD).

In addition, the first power line 300a and the second power line 300b contained in the first block region A may not be symmetrical to (or may not be identical in structure to) the first power line 310a and the second power line 310b contained in the second block region B.

In addition, a second connection pattern 360 may be formed over the second insulation film 330 of the boundary region C. The first connection pattern 350 may be formed in a ladder shape and second connection pattern 360 may be formed in a bar shape and the first and second connection patterns (350, 360) may extend in the X-axis direction perpendicular to the first power lines (300a, 310a) and the second power lines (300b, 310b). The second connection pattern 360 may be formed simultaneously with the first power lines (300a, 310a) and the second power lines (300b, 310b), or may be formed before or after formation of the first power lines (300a, 310a) and the second power lines (300b, 310b).

In this case, the first power lines (300a, 310a), the second power lines (300b, 310b), and the second connection pattern 360 may be formed over a same layer.

Thereafter, a first auxiliary pattern 305, formed by extending the first power line 300a, may be formed at one side of the first power line 300a. The first auxiliary pattern 305 may be formed to extend to a specific position overlapping the first bar pattern 350a of the first connection pattern 350 formed at a lower part. The first auxiliary pattern 305 may be electrically coupled to the contact 370 formed over and electrically coupled with the first connection pattern 350 by etching the second insulation film 330.

In addition, a second auxiliary pattern 315 formed by extending the first power line 310a may be formed on the other side of the first power line 310a. The second auxiliary pattern 315 may be formed to extend to a specific position overlapping the second bar pattern 350b of the first connection pattern 350 formed at a lower part. The second auxiliary pattern 315 may be electrically coupled to the contact 370 formed over and electrically coupled with the first connection pattern 350 by etching the second insulation film 330.

That is, all the first power lines (300a, 310a) arranged in the first block region A and the second block region B may be coupled through the first connection pattern 350 and through the contact 370. In this case, the first auxiliary pattern 305 formed by extending the first power line 300a and the second auxiliary pattern 315 formed by extending the first power line 310a may face each other and may also be formed through additional patterning processes, and each power line is designed to be longer than a conventional power line, such that the first and second auxiliary patterns (305, 315) may also be formed through only one patterning process.

A third auxiliary pattern 340 formed by extending the second power line 300b may be formed on one side of the second power line 300b. The third auxiliary pattern 340 may extend to a specific position contacting the second connection pattern 360 formed over the same layer as the second power line 300b, such that the third auxiliary pattern 340 may be electrically coupled to the second connection pattern 360.

In addition, a fourth auxiliary pattern 345 formed by extending the second power line 310b may be formed on the other side of the second power line 310b. The fourth auxiliary pattern 345 may also extend to a specific position contacting the second connection pattern 360 formed over the same layer as the second power line 310b. The second power line 310b may be electrically coupled to the second connection pattern 360 through the fourth auxiliary pattern 345.

That is, all the second power lines (300b, 310b) arranged in the first block region A and the second block region B may be connected through the second connection pattern 360.

As described above, all different power lines arranged in several block regions are coupled through connection patterns formed over different layers, such that all the power lines can be easily coupled between the block regions. Since all the power lines are easily coupled to each other, problems such as a power drop can be addressed.

As is apparent from the above description, according to embodiments of the present disclosure, a connection pattern for a power line connection is arranged in a boundary region between the block regions, the following effects can be obtained.

First, all the same power lines arranged in the plurality of block regions can be interconnected, resulting in facilitation of current supply.

Second, all the same power lines arranged in the plurality of block regions are interconnected, such that the occurrence of power drop can be prevented and operation characteristics of the semiconductor device can be improved.

Those skilled in the art will appreciate that embodiments of the present disclosure may be carried out in other ways than those set forth herein without departing from the scope and characteristics of these embodiments. The above embodiments are therefore to be construed in all aspects as illustrative and not restrictive.

The above embodiments of the present disclosure are illustrative and not limitative. Various alternatives and equivalents are possible. The invention is not limited by the type of deposition, etching polishing, and patterning steps described herein. Nor are embodiments limited to any specific type of semiconductor devices. For example, embodiments may be implemented in a dynamic random access memory (DRAM) device or non volatile memory device. Other additions, subtractions, or modifications are obvious in view of the present disclosure and are intended to fall within the scope of the appended claims.

The power layout structure of a semiconductor device discussed above (see FIGS. 1-3) is particularly useful in the design of memory devices, processors, and computer systems. For example, referring to FIG. 4, a block diagram of a system employing a semiconductor device having a power layout structure in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device having a power layout structure as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device having a power layout structure as discussed above in relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor device and/or a power layout structure as discussed above with relation to FIGS. 1-3. In alternate embodiments, such as, for example but not limited to, cellular phones or digital cameras, the components may differ from the embodiments illustrated in FIG. 4.

Figure 4:
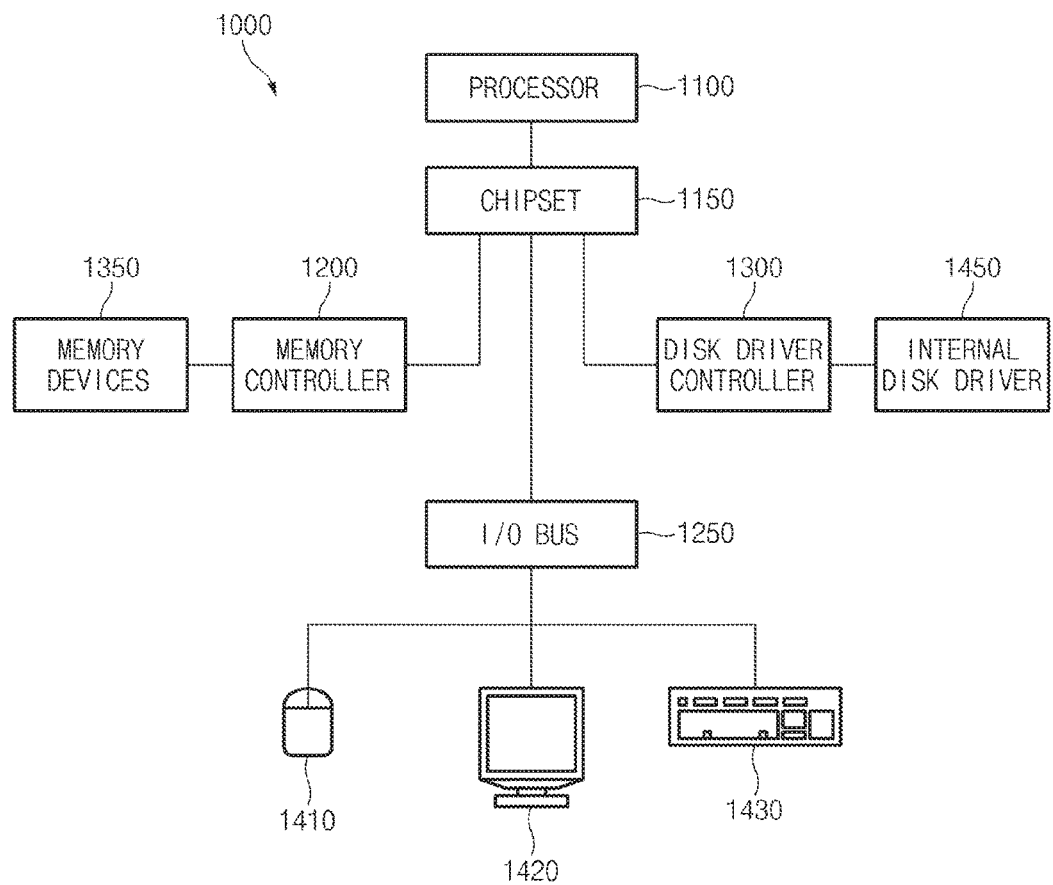
FIG. 4 illustrates a block diagram of an example system employing a semiconductor device in accordance with the various embodiments discussed above with relation to FIGS. 1-3.

FIG. 4 illustrates a block diagram of an example of a representation of a system employing semiconductor devices and/or a power layout structure in accordance with the various embodiments discussed above with relation to FIGS. 1-3.

What is claimed is:

1. A power line layout structure of a semiconductor device comprising:
    a first block region including a plurality of first power lines and a plurality of second power lines;
    a second block region including a plurality of first power lines and a plurality of second power lines, and spaced apart from the first block region by a predetermined distance;
    a first connection pattern arranged between the first block region and the second block region, and formed to interconnect the first power lines of the first block region and the first power lines of the second block region; and
    a second connection pattern arranged between the first block region and the second block region, and formed to interconnect the second power lines of the first block region and the second power lines of the second block region,
    wherein the first connection pattern and the second connection pattern are formed over different layers, and the second connection pattern is formed over the same layer as the second power lines.

2. The power line layout structure according to claim 1, wherein the first power lines and the second power lines are formed in a line shape.

3. The power line layout structure according to claim 1, wherein:
    each of the first power lines and each of the second power lines are respectively formed to receive any one selected from among a power-supply voltage and a ground voltage.

4. The power line layout structure according to claim 1, wherein the first connection pattern is formed over a lower layer than the second connection pattern.

5. The power line layout structure according to claim 1, wherein the first power lines and the second power lines are formed over the same layer.

6. The power line layout structure according to claim 1, wherein the first connection pattern is formed over a layer different from that of the first power lines.

7. The power line layout structure according to claim 1, wherein the first connection pattern is formed in a ladder or pad shape.

8. The power line layout structure according to claim 1, wherein the first connection pattern includes:
    a first bar pattern formed to extend perpendicular to the first power line;
    a second bar pattern spaced apart from the first bar pattern by a predetermined distance, and formed to extend parallel to the first bar pattern; and
    a plurality of third bar patterns perpendicular to the first bar pattern and the second bar pattern, and formed to interconnect the first bar pattern and the second bar pattern.

9. The power line layout structure according to claim 8, wherein the first connection pattern further includes:

an auxiliary pattern formed to extend to the first connection patterns facing each other in the first power lines; and a contact coupled to the auxiliary pattern.

10. The power line layout structure according to claim 9, wherein:

the first power lines of the first block region are coupled to the first bar pattern through the contact; and the first power lines of the second block region are coupled to the second bar pattern through the contact.

11. The power line layout structure according to claim 1, wherein the second connection pattern is formed in a bar shape.

12. The power line layout structure according to claim 1, wherein the second connection pattern is formed to extend perpendicular to the first power lines and the second power lines.

13. The power line layout structure according to claim 1, further comprising:

auxiliary patterns formed to extend to the second connection patterns and face each other in the second power lines, wherein the auxiliary pattern is coupled to the second connection pattern.

* * * * *